(12) United States Patent
Ishihara et al.

(10) Patent No.: US 12,707,930 B2
(45) Date of Patent: Aug. 11, 2026

(54) WAFER STORAGE CONTAINER PROCESSING APPARATUS

(71) Applicant: SHIBAURA MECHATRONICS CORPORATION, Kanagawa (JP)

(72) Inventors: Junji Ishihara, Kanagawa (JP); Hisaaki Miyasako, Kanagawa (JP); Yukinobu Nishibe, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 60 days.

(21) Appl. No.: 18/894,512

(22) Filed: Sep. 24, 2024

(65) Prior Publication Data

US 2025/0112070 A1 Apr. 3, 2025

(30) Foreign Application Priority Data

Sep. 28, 2023 (JP) ................................ 2023-168678

(51) Int. Cl.
*H01L 21/673* (2006.01)
*H10P 72/10* (2026.01)

(52) U.S. Cl.
CPC ...... *H10P 72/1924* (2026.01); *H10P 72/1914* (2026.01)

(58) Field of Classification Search
CPC ............. H10P 72/1924; H10P 72/1914; H10P 72/3404; H10P 72/1926; H10P 72/3406; H10P 72/0402; H10P 72/0604; H10P 72/0616; H10P 72/3408
See application file for complete search history.

(56) References Cited

U.S. PATENT DOCUMENTS 8,591,664 B2 * 11/2013 Rebstock ............ H10P 72/0408 414/754
9,960,065 B2 * 5/2018 Kawasaki ........... H10P 72/1926
10,403,514 B1 * 9/2019 Hagino ............... H10P 72/0402
2006/0088406 A1 * 4/2006 Miyajima ........... H10P 72/0402 414/217
2014/0305540 A1 * 10/2014 Oyama ............... H10P 72/1924 141/4
2019/0304822 A1 10/2019 Tsubaki et al.
2019/0326134 A1 * 10/2019 Suzuki ................ H10P 72/0402
(Continued)

FOREIGN PATENT DOCUMENTS

JP 2005-109523 A 4/2005
KR 20120027010 A 3/2012
(Continued)

*Primary Examiner* — Alexander Markoff
(74) *Attorney, Agent, or Firm* — Venjuris, P.C.

(57) ABSTRACT

According to one embodiment, a wafer storage container processing apparatus that processes a wafer storage container including a body having a storage space connected to an opening and a door detachable from the opening, includes a stage having a disposition surface on which the wafer storage container is disposed; and a gas supply configured to supply an inert gas to the wafer storage container disposed on the stage. The stage disposes the wafer storage container such that the door is disposed on the disposition surface in a state where the door is attached to the body, and the gas supply supplies the inert gas through a gas supply port provided on an intersecting surface of the body that intersects a surface having the opening.

6 Claims, 8 Drawing Sheets

(56) References Cited

U.S. PATENT DOCUMENTS

2019/0362995 A1* 11/2019 Ito ........................ H10P 72/0618
2021/0215752 A1* 7/2021 Ito ........................ G01R 31/2637
2025/0108414 A1* 4/2025 Ishihara .................. B08B 9/205
2025/0108415 A1* 4/2025 Ishihara .................... B08B 9/28
2025/0112070 A1* 4/2025 Ishihara .............. H10P 72/1924

FOREIGN PATENT DOCUMENTS

KR 102262852 B1 6/2021
WO 2017212841 A1 12/2017

* cited by examiner

WAFER STORAGE CONTAINER PROCESSING APPARATUS

CROSS-REFERENCE TO RELATED APPLICATIONS

This application is based on and claims priority from Japanese Patent Application No. 2023-168678 filed on Sep. 28, 2023 with the Japan Patent Office, the disclosure of which is incorporated herein in its entirety by reference.

TECHNICAL FIELD

The present disclosure relates to a wafer storage container processing apparatus.

BACKGROUND

In the related art, a wafer storage container processing apparatus performs various processes such as cleaning and drying on wafer storage containers such as front opening unified pods (FOUPs) that accommodate semiconductor wafers.

There is a technique for replacing a gas in a storage space that stores the wafers in the FOUP, by supplying an inert gas such as $N_2$ to the storage space, in a state where the door is attached to the body (shell) of the FOUP. For example, a supply port through which the inert gas is supplied and a discharge port through which the gas in the storage space is discharged, are provided on the bottom 20*i* of the shell 20*a* as illustrated in FIG. 8.

The accuracy of FOUPs tends to vary depending on the manufacturer. Therefore, in some of the FOUPs, as illustrated in FIG. 8, a small gap 20*j* may occur between the shell 20*a* and the door 20*b*. In addition, due to the age-related deterioration and other factors, in some of the FOUPs, a small gap 20*j* may occur between the shell 20*a* and the door 20*b*. Therefore, when replacing the gas in the storage space, the inert gas supplied from the supply port may leak through the gap 20*j*. In this case, the gas in the storage space may not be replaced efficiently. Such a problem exists not only in the FOUPs, but also in other wafer storage containers such as front opening shipping boxes (FOSBs). See, for example, Japanese Patent Laid-Open Publication No. 2005-109523.

SUMMARY

The present disclosure provides a wafer storage container processing apparatus capable of efficiently replacing a gas in a wafer storage container.

A wafer storage container processing apparatus according to an embodiment of the present disclosure processes a wafer storage container including a body having a storage space connected to an opening and a door detachable from the opening. The wafer storage container processing apparatus includes a stage having a disposition surface on which the wafer storage container is disposed; and a gas supply that supplies an inert gas to the wafer storage container disposed on the stage. The stage disposes the wafer storage container thereon such that the door is disposed on the disposition surface in a state where the door is attached to the body, and the gas supply supplies the inert gas through a gas supply port provided on an intersecting surface of the body that intersects a surface having the opening.

According to an embodiment of the present disclosure, it is possible to provide a wafer storage container processing apparatus capable of efficiently replacing gas in a storage space.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

Figure 8:
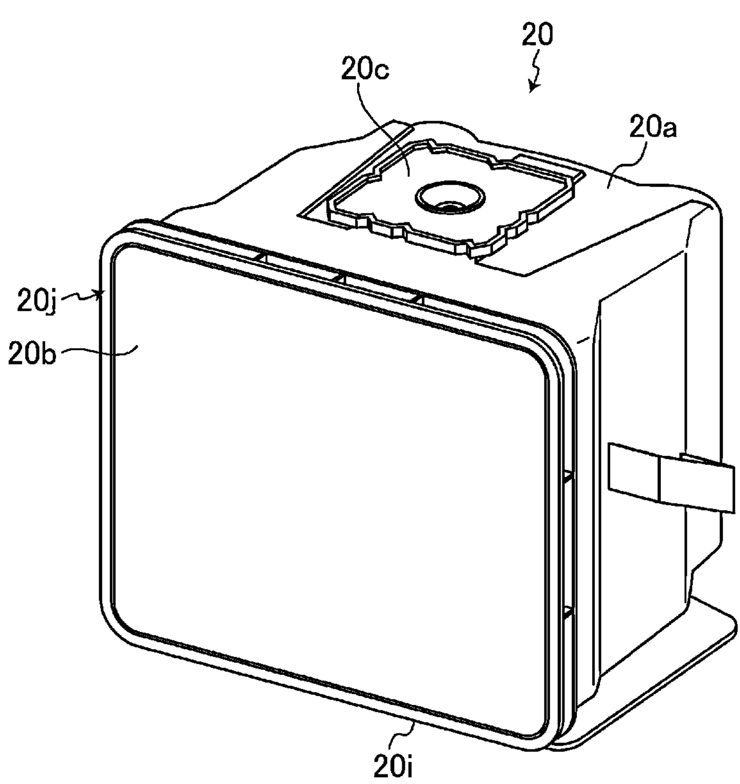
FIG. 8 is a view illustrating an example of a configuration of a wafer storage container.

Hereinafter, embodiments of a wafer storage container processing apparatus disclosed herein are described in detail with reference to the accompanying drawings. The wafer storage container processing apparatus disclosed herein is not limited to the following embodiments. In the following embodiments, a wafer storage container to be subjected to various processes such as cleaning and drying is described as a FOUP, but the wafer storage container to be subjected to various processes is not limited thereto. For example, the wafer storage container to be subjected to various processes may be a FOSB. The FOUP is provided with a flange 20*c* (see, e.g., FIG. 8), and the FOUP is transported by a robot grasping the flange 20*c*.

Embodiment

Figure 1:
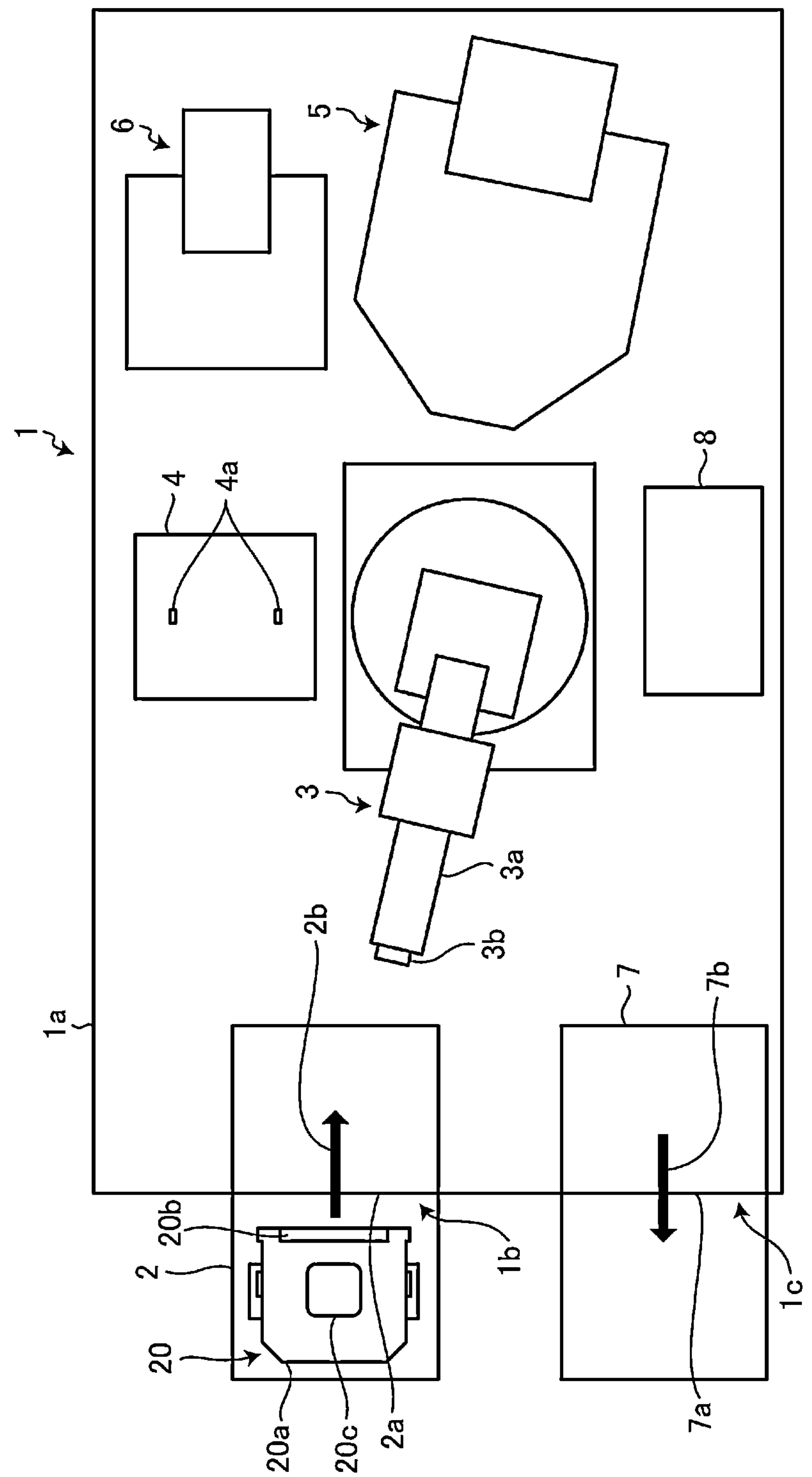
FIG. 1 is a plan view illustrating an example of a schematic configuration of a wafer storage processing apparatus according to an embodiment.

FIG. 1 is a plan view illustrating an example of a schematic configuration of a wafer storage processing apparatus 1 according to an embodiment. The wafer storage container processing apparatus 1 is installed, for example, in a factory that manufactures semiconductor wafers, and cleans and dries wafer storage containers.

As illustrated in FIG. 1, the wafer storage container processing apparatus 1 includes a load port 2, a robot 3, a lock/unlock stage 4, a cleaning chamber 5, a drying chamber 6, an unload port 7, and a control unit 8.

The robot 3, the lock/unlock stage 4, the cleaning chamber 5, the drying chamber 6, and the control unit 8 are provided inside a casing 1*a* of the wafer storage container processing apparatus 1. Meanwhile, the load port 2 and the unload port 7 are provided across the inside and outside of the casing 1*a* of the wafer storage container processing apparatus 1.

The load port 2 carries the FOUP 20 to be cleaned and dried, which is disposed on the outside of the casing 1*a* of the load port 2, into the inside of the casing 1*a*. The FOUP 20 includes a shell 20*a*, which is the FOUP body, and a door 20*b*. The shell 20*a* has an opening (shell opening) and a storage space for storing semiconductor wafers. The storage space is located inside the shell opening and communicates with the shell opening. The door 20*b* is lockable/unlockable with the shell 20*a*. The door 20*b* is attachable to and detachable from the shell opening. The shell 20*a* is an example of the body. The shell 20*a* is provided with a flange 20*c*. The flange 20*c* is a part that is grasped (held) when the FOUP 20 is transported by an overhead hoist transport (OHT) or a robot 3, and is provided on a surface that intersects with a surface of the shell 20*a* that has the shell opening.

For example, the FOUP 20 transported by the OHT is disposed on the outside of the casing 1*a* of the load port 2. For example, as illustrated in FIG. 1, the FOUP 20 is disposed such that the door 20*b* of the FOUP 20 faces a shutter 2*a* provided at the opening 1*b* of the casing 1*a*. When the FOUP 20 is disposed on the load port 2 in this manner, the shutter 2*a* is raised. As a result, the FOUP 20 may be carried into the casing 1*a* from the opening 1*b*. That is, the FOUP 20 becomes ready to be carried into the wafer storage container processing apparatus 1. Then, the FOUP 20 is slid in the direction of an arrow 2*b* by a slide device of the load port 2. As a result, the FOUP 20 is carried into the casing 1*a*.

The sliding by the sliding device is described. For example, a pin provided on the sliding device is inserted into a hole provided on a bottom surface 20*g* (see, e.g., FIG. 3) of the FOUP 20, so that the bottom surface 20*g* of the FOUP 20 is fixed to the sliding device. In this state, when the sliding device is slid in the direction of the arrow 2*b*, the FOUP 20 is also slid along with the movement of the sliding device. As a result, the FOUP 20 is disposed on a predetermined portion inside the casing 1*a* of the load port 2. When the FOUP 20 is carried into the inside of the casing 1*a* in this manner, the shutter 2*a* is lowered, so that the opening 1*b* of the casing 1*a* is closed. The sliding device moves down together with the pin to a position lower than the lower end of the shutter 2*a* (the bottom surface 20*g* of the FOUP 20) and returns to the original position outside the casing 1*a*.

The robot 3 transports the FOUP 20 to each section while gripping the flange 20*c* of the FOUP 20. The robot 3 includes a robot arm 3*a* and a robot hand 3*b* (a gripping unit of the robot 3). The robot 3 transports the FOUP 20 to each section by extending, contracting, and rotating the robot arm 3*a* while the robot hand 3*b* is grasping the flange 20*c*. When the robot 3 transports the door 20*b* alone that has been separated (unlocked) from the shell 20*a*, the robot 3 transports the door 20*b* by gripping both sides of the door 20*b*.

The lock/unlock stage 4 is an example of a stage. For example, the lock/unlock stage 4 is a stage on which the FOUP 20 is disposed, and separates (unlocks) the FOUP 20 into a shell 20*a* and a door 20*b*, and connects (locks) the shell 20*a* and the door 20*b*. For example, the FOUP 20 that has been carried into the casing 1*a* is transported to the lock/unlock stage 4 by the robot 3. At this time, the lock/unlock stage 4 separates the FOUP 20 into the shell 20*a* and the door 20*b*.

The cleaning chamber 5 is a chamber for cleaning the FOUP 20. For example, the shell 20*a* and the door 20*b* are transported separately to the cleaning chamber 5 by the robot 3. Then, the cleaning chamber 5 performs a cleaning process on the FOUP 20 while holding the shell 20*a* and the door 20*b* separately. That is, the cleaning chamber 5 cleans the storage space while the shell 20*a* and the door 20*b* are separated. For example, the cleaning chamber 5 holds the door 20*b* in the lid portion of the cleaning chamber 5 and the shell 20*a* in the chamber portion of the cleaning chamber 5 (the cleaning chamber body of the cleaning chamber 5), and while rotating them by a rotation mechanism (not illustrated), a cleaning liquid (e.g., deionized water) is discharged from a cleaning liquid nozzle onto each of the shell 20*a* and the door 20*b*, thereby cleaning the FOUP 20. In the cleaning chamber 5, the shell 20*a* may be arranged such that the shell opening faces downward, taking into consideration the efficiency of discharging the cleaning liquid. The cleaning chamber 5 is an example of a cleaning section.

When cleaning of the FOUP 20 is completed in the cleaning chamber 5, the shell 20*a* and door 20*b* are then rotated in the cleaning chamber 5 and dried by blowing dry air thereto. The drying in the cleaning chamber 5 is a process for removing the cleaning liquid adhering to the FOUP 20 (temporary drying). When the temporary drying of the FOUP 20 in the cleaning chamber 5 is completed, the robot 3 transports the shell 20*a* and door 20*b* in the cleaning chamber 5 separately to the drying chamber 6.

The drying chamber 6 is a device for vacuum drying the FOUP 20 (main drying). When the vacuum drying of the FOUP 20 is completed in the drying chamber 6, the robot 3 transports the shell 20*a* and the door 20*b* in the drying chamber 6 separately onto the lock/unlock stage 4. Then, the lock/unlock stage 4 connects the shell 20*a* and the door 20*b*. In the embodiment, after the main drying in the drying chamber 6, an inert gas such as $N_2$ is supplied to the storage space of the FOUP 20 in which the shell 20*a* and the door 20*b* are connected on the lock/unlock stage 4, thereby replacing the gas in the storage space. Such a gas replacement process is also called a purging process. The configuration of the lock/unlock stage 4 and a specific example of the purging process performed by the lock/unlock stage 4 is described later.

The unload port 7 carries out the FOUP 20 that has been cleaned, vacuum-dried, and purged and that has been disposed by the robot 3 in a portion inside the casing 1*a* of the unload port 7, to the outside of the casing 1*a*.

For example, after the purging process, the FOUP 20 is transported by the robot 3 and disposed in a portion inside the casing 1*a* of the unload port 7. When the FOUP 20 is disposed in the unload port 7 in this manner, the shutter 7*a* provided at the opening 1*c* of the casing 1*a* is raised. As a result, the FOUP 20 may be carried out from the opening 1*c* to the outside of the casing 1*a*. That is, the FOUP 20 becomes ready to be carried out to the outside of the wafer storage container processing apparatus 1. Then, the FOUP 20 is slid in the direction of an arrow 7*b* by the slide device of the unload port 7 (having the same mechanism as the slide device of the load port 2), and the FOUP 20 is carried out to the outside of the casing 1*a*. When the FOUP 20 is carried out to the outside of the casing 1*a* in this manner, the shutter 7*a* is lowered, so that the opening 1*c* of the casing 1*a* is closed.

The controller 8 controls the overall operation of the wafer storage container processing apparatus 1. For example, the control unit 8 controls the load port 2, the robot 3, the lock/unlock stage 4, the cleaning chamber 5, the drying chamber 6, and the unload port 7, thereby operating the load port 2, the robot 3, the lock/unlock stage 4, the cleaning chamber 5, the drying chamber 6, and the unload port 7 as described above. In addition, the control unit 8 controls a gas supply nozzle 4*c*, valves 4*e*1, 4*f*1, 4*j*1, and a measurement unit 4*h*, which will be described later.

For example, the control unit 8 includes a central processing unit (CPU), a read only memory (ROM), a random access memory (RAM), a hard disk drive (HDD), and a communication interface. These are connected via an internal bus.

The CPU executes various processes while using the memory area of the RAM as a temporary storage area for data used in the various processes. The ROM and HDD store programs for executing various processes such as the above-mentioned purging process, and various databases and tables used when executing the various processes. The communication interface is an interface for communicating with the above-mentioned units of the wafer storage container processing apparatus 1, and also for communicating with external devices connected to the wafer storage container processing apparatus 1 via a network. For example, the communication interface is a network interface card.

Figure 2:
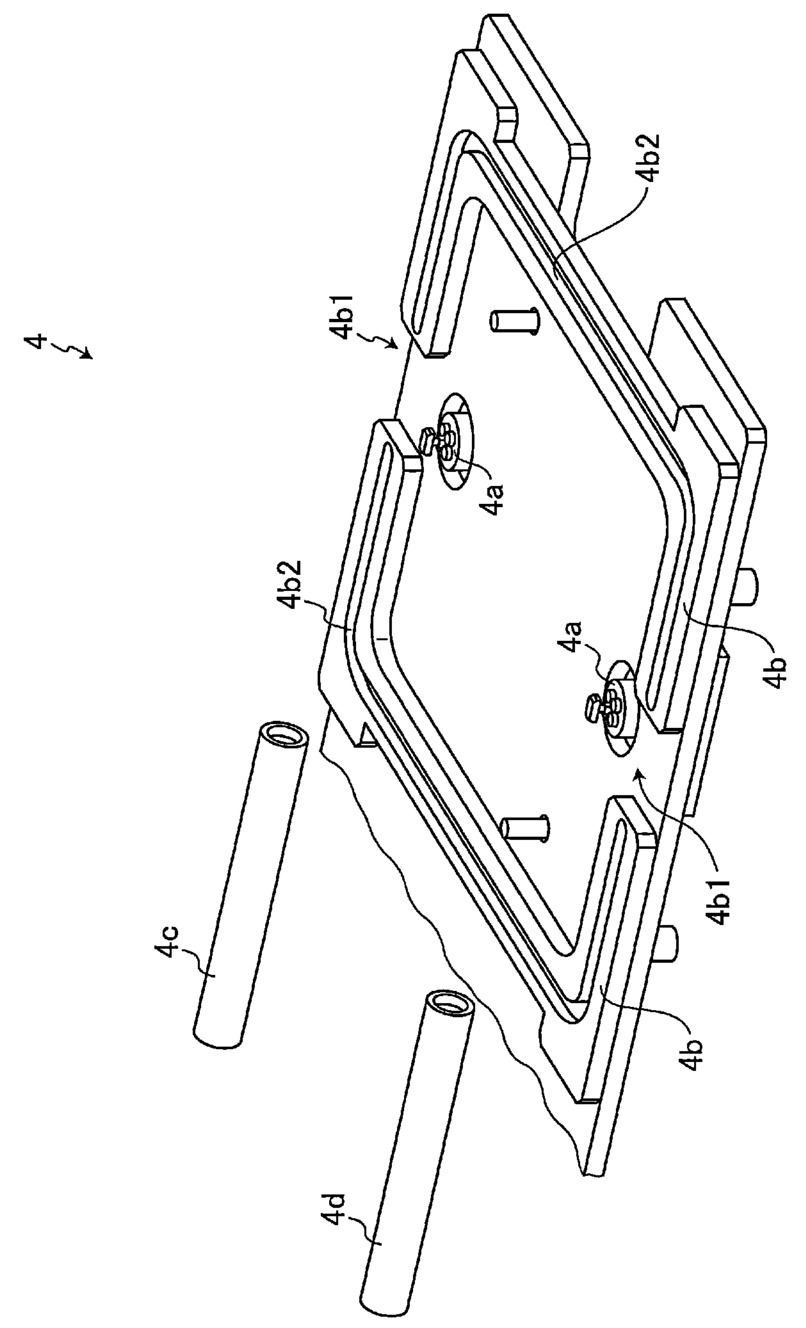
FIG. 2 is a perspective view of a lock/unlock stage according to an embodiment.
Figure 3:
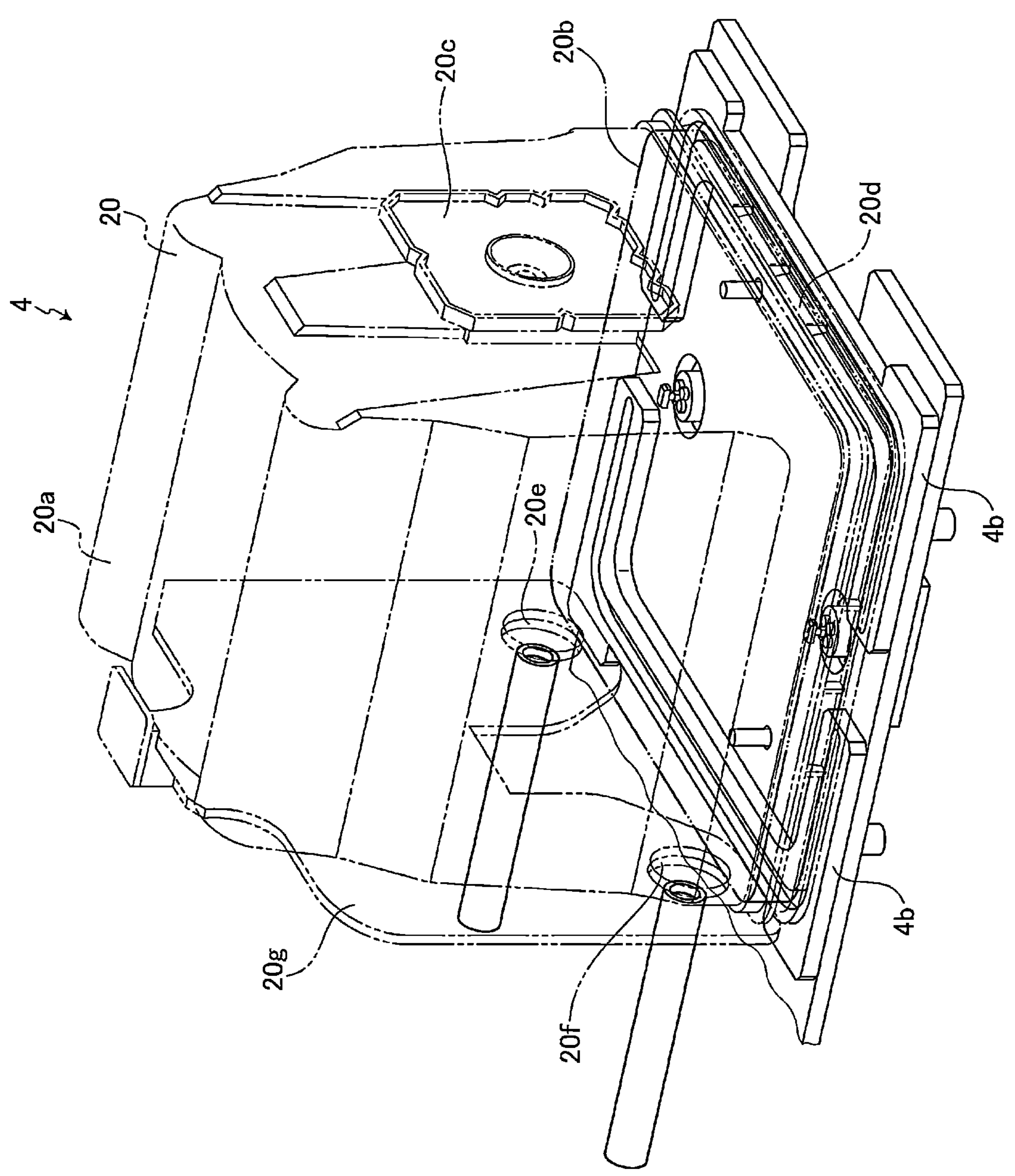
FIG. 3 is a perspective view of a lock/unlock stage according to an embodiment.
Figure 4:
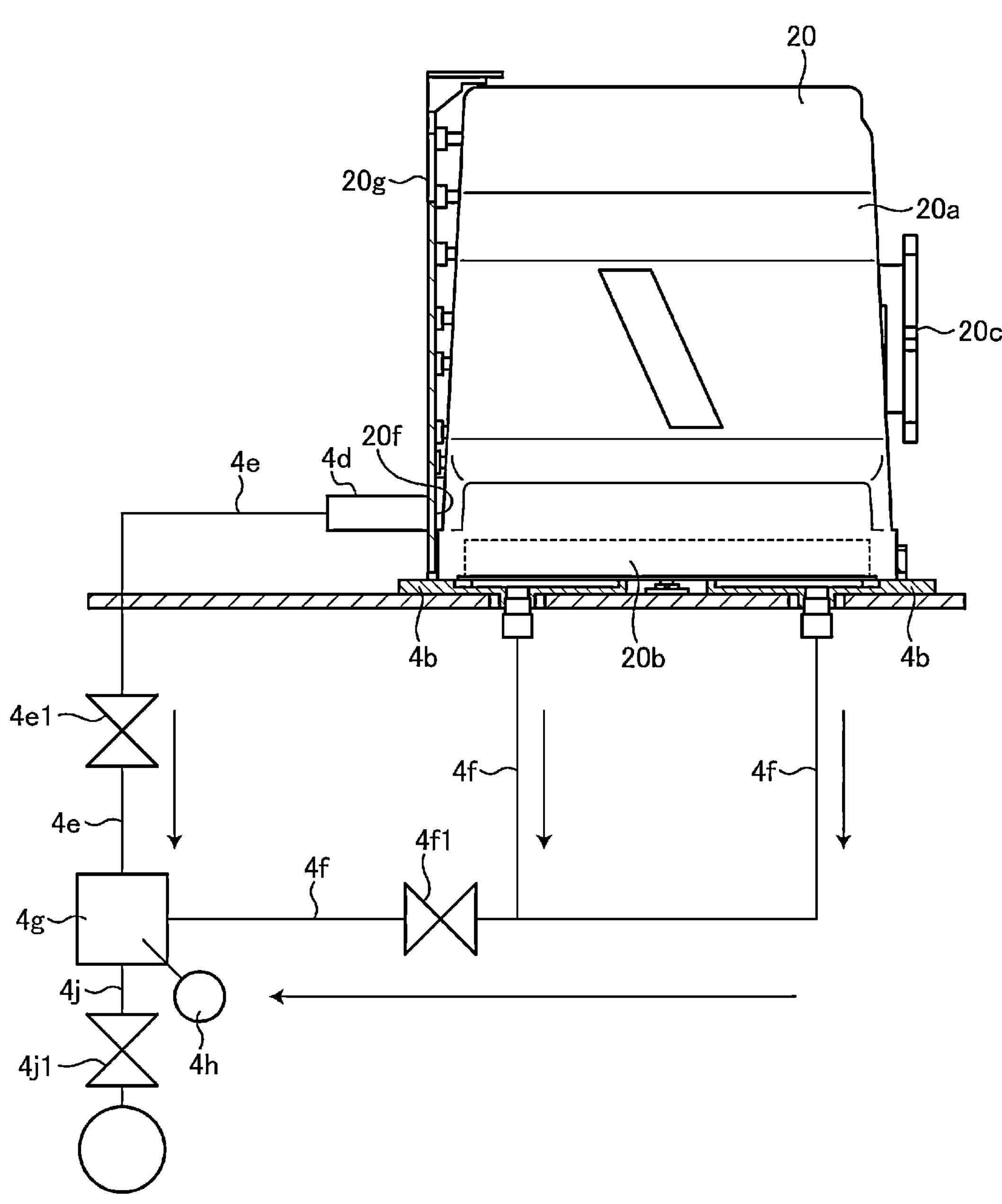
FIG. 4 is a side view of a lock/unlock stage according to an embodiment.

Next, an example of the configuration of the lock/unlock stage 4 according to the present embodiment is described. FIGS. 2, 3, and 4 are views illustrating an example of the configuration of the lock/unlock stage 4 according to the embodiment. FIGS. 2 and 3 are perspective views of the lock/unlock stage 4 according to the embodiment. FIG. 2 illustrates a state where the FOUP 20 is not disposed on the lock/unlock stage 4, and FIG. 3 illustrates a state where the FOUP 20 is disposed on the lock/unlock stage 4. In addition, FIG. 4 is a side view of the lock/unlock stage 4 according to the embodiment.

As illustrated in FIGS. 2, 3, and 4, the lock/unlock stage 4 includes two latch keys 4*a*, two frames 4*b*, a gas supply nozzle 4*c*, a gas exhaust nozzle 4*d*, a pipe 4*e*, a pipe 4*f*, and a collection box 4*g*.

The latch key 4*a* rotates while being inserted into a keyhole formed in the door 20*b* of the FOUP 20, thereby separating the FOUP 20 into the shell 20*a* and the door 20*b*, or connecting the shell 20*a* and the door 20*b*. For example, when the keyhole of the door 20*b* is a rectangular recess, the latch key 4*a* has a so-called T-shape with its head formed into a rectangular parallelepiped corresponding to the keyhole of the door 20*b*.

The two frames 4*b* have a so-called U-shape facing each other in a plan view. The two frames 4*b* are provided with the open sides of the U-shape facing each other, and the approximately annular shape formed by the two frames 4*b* has a size corresponding to the outer shape of the door 20*b*. The door 20*b* is disposed on the annular shape formed by the two frames 4*b*. The two frames 4*b* are separated by a predetermined distance. Therefore, two gaps 4*b*1 are formed between the two frames 4*b*, and the gaps 4*b*1 are used as spaces for the robot arm 3*a* of the robot 3 to enter when the robot arm 3*a* disposes the door 20*b* on the frame 4*b*.

The disposition surface of the door 20*b* is not limited to the shape of the two U-shaped frames 4*b*. For example, the frame may be a rectangular frame that does not have the gap 4*b*1, which is the space for the robot arm 3*a* to enter. When the FOUP 20 is disposed on the two U-shaped frames 4*b*, if a gap between the shell 20*a* and the door 20*b* exists in the gap 4*b*1 (the space for the robot arm 3*a* to enter), gas will leak from there. However, when the frame is a rectangular frame without the gap 4*b*1, gas leakage may be minimized. At this time, when only the door 20*b* is held by the robot hand 3*b*, a mechanism may be newly provided to raise the door 20*b*, thereby raising the door 20*b*.

In the embodiment, after the FOUP 20 has been main-dried in the drying chamber 6, the robot 3 first grasps the door 20*b* from the drying chamber 6 and transports the door 20*b* to the frame 4*b* of the lock/unlock stage 4, and then disposes the door 20*b* on the frame 4*b*. Next, the robot 3 grasps and transports the shell 20*a* to the frame 4*b*, and disposes the shell 20*a* on the door 20*b*. At this time, the robot 3 disposes the shell 20*a* on the door 20*b* in a state where the shell 20*a* is positioned with respect to the door 20*b*.

When the shell 20*a* is disposed on the door 20*b*, the latch key 4*a* connects the shell 20*a* and the door 20*b*. As a result, the lock/unlock stage 4 disposes the FOUP 20 such that the door 20*b* is disposed on the disposition surface (the upper surface of the frame 4*b*) in a state where the door 20*b* and the shell 20*a* are attached. In addition, the lock/unlock stage 4 has a detachment function for locking/unlocking the door 20*b* with respect to the shell 20*a* when the door 20*b* is disposed on the disposition surface.

Here, a groove 4*b*2 is formed in the frame 4*b*. In addition, in the embodiment, a gap 20*d* is formed between the shell 20*a* and the door 20*b* in a state where the shell 20*a* and the door 20*b* are connected. In the embodiment, the groove 4*b*2 is formed in the frame 4*b* such that the space formed by the groove 4*b*2 communicates with the space of the gap 20*d* in a state where the FOUP 20 is disposed on the frame 4*b*. As illustrated in FIG. 2, the groove 4*b*2 is open only on the upper surface side of the frame 4*b*, and the end of the frame 4*b* on the gap 4*b*1 side is closed. That is, when the FOUP 20 is disposed on the upper surface of the frame 4*b*, the groove 4*b*2 is completely blocked.

As illustrated in FIG. 3, a gas supply port 20*e* and a gas exhaust port 20*f* are provided on the bottom surface 20*g* of the shell 20*a*, i.e., the surface (intersecting surface) 20*g* intersecting with a surface having an opening. In the state where the FOUP 20 is disposed on the frame 4*b*, the gas supply nozzle 4*c* is coupled (connected) to the gas supply port 20*e*, and the gas exhaust nozzle 4*d* is inserted into the gas exhaust port 20*f*. That is, the gas supply nozzle 4*c* and the gas exhaust nozzle 4*d* are disposed at positions corresponding to the gas supply port 20*e* and the gas exhaust port 20*f* when the FOUP 20 is disposed on the frame 4*b*.

The gas supply nozzle 4*c* is connected to a gas tank in which an inert gas such as $N_2$ is stored, and supplies the inert gas supplied from the gas tank to the storage space of the shell 20*a* via the gas supply port 20*e*. In this manner, the gas supply nozzle 4*c* supplies the inert gas to the storage space of the FOUP 20 disposed on the lock/unlock stage 4, thereby replacing the gas in the storage space. The gas supply nozzle 4*c* and the gas tank are an example of a gas supply.

Figure 5:
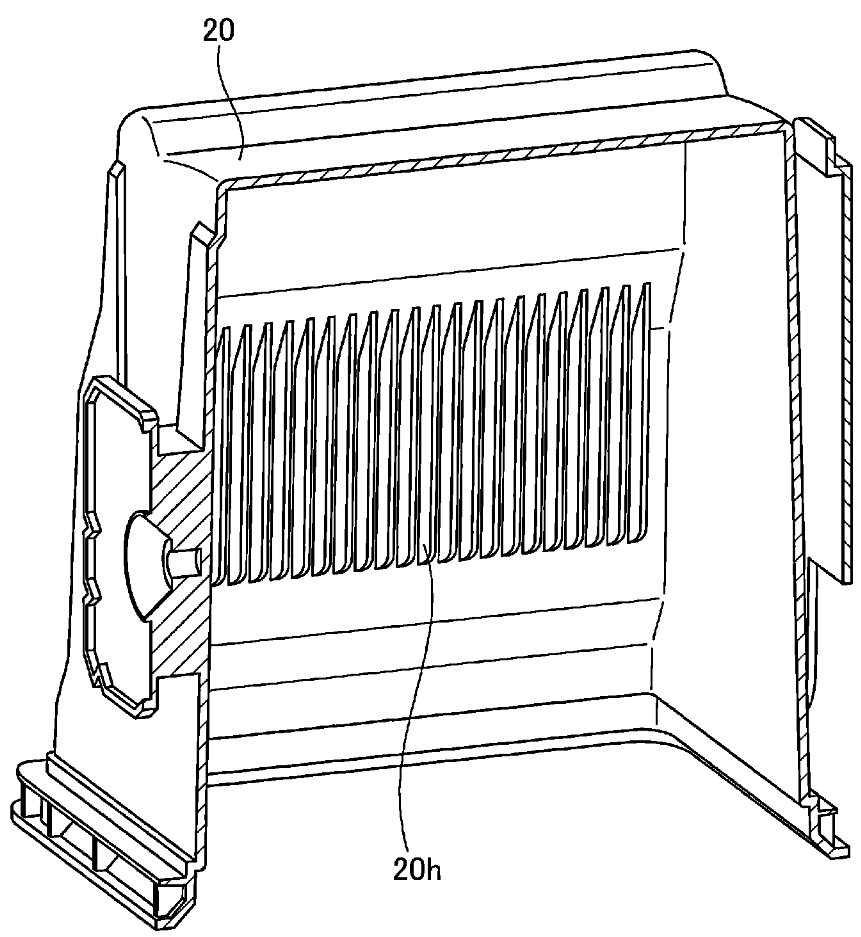
FIG. 5 is a view for explaining an example of an arrangement of slots according to an embodiment.

As described above, the bottom surface 20*g* of the FOUP 20 (shell 20*a*) is provided with a gas supply port 20*e* for supplying a gas. When the FOUP 20 is disposed such that the door 20*b* is disposed on the upper surface of the frame 4*b*, which is the disposition surface, the bottom surface 20*g* of the FOUP 20 (shell 20*a*) on which the gas supply port 20*e* is provided is located on the left side of FIG. 4. Thus, when the FOUP 20 is disposed on the frame 4*b*, which is the placement surface, as illustrated in FIG. 5, a slot (shelf) 20*h* of the shell 20*a*, which has a planar shape on which the semiconductor wafer is disposed, extends vertically. Therefore, when dust adheres to the slot 20*h* in the shell 20*a*, the dust is easily moved to the door 20*b* side located below because gravity acts on the dust in addition to the momentum of the gas supply, and the dust may be prevented from remaining in the slot 20*h*. FIG. 5 is a view for explaining an example of an arrangement of slots 20*h* according to an embodiment.

In addition, As illustrated in FIG. 4, the gas present in the storage space of the shell 20*a* is discharged through the gas discharge nozzle 4*d* via the gas discharge port 20*f*. The gas discharge nozzle 4*d* is connected to a pipe 4*e*, which is connected to a collection box 4*g*. Thus, the gas discharged from the storage space of the shell 20*a* flows into the collection box 4*g* via the gas discharge port 20*f*, the gas discharge nozzle 4*d*, and the pipe 4*e*. In this way, the collection box 4*g* collects the gas discharged from the storage space. In addition, a valve 4*e*1 is provided on the path through which the gas flows in the pipe 4*e*, and the valve 4*e*1 adjusts the inflow of the gas into the collection box 4*g* by its opening and closing.

In addition, the groove 4*b*2 is connected to a pipe 4*f* for gas collection provided on the opposite side to the side where the frame 4*b* is provided. That is, the space formed by the groove 4*b*2 is connected to the space in the pipe 4*f*. The pipe 4*f* is connected to the collection box 4*g*. The gas present in the groove 4*b*2 flows into the collection box 4*g* through the pipe 4*f*. Therefore, the gas leaking from the gap 20*d* between the shell 20*a* and the door 20*b* flows into the collection box 4*g* through the groove 4*b*2 and the pipe 4*f*. In this way, the collection box 4*g* collects the gas leaking from the gap 20*d*. In addition, a valve 4*f*1 is provided on the path through which the gas flows in the pipe 4*f*, and the valve 4*f*1 adjusts the inflow of the gas into the collection box 4*g* by its opening and closing. The valve 4*f*1 is provided between the collection box 4*g* and the point where the two pipes 4*f* that collect gas from the groove 4*b*2 join together.

In the groove 4*b*2, an inert gas is discharged from the storage space of the shell 20*a* through the gap 20*d*. Therefore, the space formed by the groove 4*b*2 gradually becomes positive pressure due to the discharged gas. The gas in the groove 4*b*2 is pushed by the positive pressure and guided to the collection box 4*g*. A suction source such as a pump may be provided at the end of the pipe 4*f*, so that the gas is actively collected by the collection box 4*g*. By suctioning with the suction source in this way, the gas replacement efficiency may be improved.

Here, as described above, due to the small gap 20*d* between the door 20*b* and the shell 20*a*, gas leaks from the storage space through the gap 20*d* as the replacement of the gas in the storage space progresses. The leaking gas contains oxygen similar to the air in the clean room in which the wafer storage container processing apparatus 1 is installed, and also contains moisture similar to the air in the clean room, immediately after the start of gas supply. However, as time passes after the start of supply, the inert gas supplied from the gas supply nozzle 4*c* gradually leaks out from the gap 20*d*.

The collection box 4*g* collects the gas and stores the collected gas. For example, the collection box 4*g* collects the gas leaking from the gap 20*d* and the gas discharged from the gas discharge port 20*f*. That is, the collection box 4*g* collects gases in which the gas leaking from the gap 20*d* and the gas discharged from the gas discharge port 20*f* are mixed (mixed gas). In this way, the collection box 4*g* collects the gas leaking from the gap 20*d* between the shell 20*a* and the door 20*b*, which is present in the storage space to be replaced by the inert gas supplied from the gas supply nozzle 4*c*. In addition, the collection box 4*g* collects the gas discharged from the gas discharge port 20*f*, which is present in the storage space to be replaced by the inert gas supplied from the gas supply nozzle 4*c*. The collection box 4*g*, the gas discharge port 20*f*, the pipes 4*e*, 4*f*, and the valves 4*e*1, 4*f*1 are an example of a gas collector.

The collection box 4*g* includes a measurement unit 4*h* therein that measures the oxygen concentration of the gas stored in the collection box 4*g*. The measurement unit 4*h* is an example of a gauge. The measurement unit 4*h* measures the oxygen concentration at a predetermined time interval and transmits the measured oxygen concentration to the control unit 8. The measurement unit 4*h* is, for example, an oxygen concentration meter that measures the oxygen concentration of the gas and transmits the measured oxygen concentration to the control unit 8. The measurement unit 4*h* may be, for example, a hygrometer. In this case, the hygrometer measures the humidity of the gas and transmits the measured humidity to the control unit 8.

In addition, a pipe 4*j* for exhausting the collected gas is connected to the collection box 4*g*. Further, a valve 4*j*1 is provided on the path through which the gas flows in the pipe 4*j*. When the collected gas is exhausted, the gas flows through the pipe 4*j* in a state where the valve 4*j*1 is open. Here, a suction source such as a pump may be provided at the end of the pipe 4*j* so that the gas is actively exhausted. By suctioning with the suction source in this manner, the gas exhaust efficiency may be improved.

The control unit 8 according to the present embodiment controls the supply of an inert gas to the storage space based on the measured value transmitted from the measurement unit 4*h*. For example, the control unit 8 compares the measured value with a predetermined value, and when the measured value is equal to or greater than the predetermined value, controls the gas supply nozzle 4*c* such that the supply of the inert gas is continued. Meanwhile, when the measured value is below the predetermined value, it is considered that the storage space of the shell 20*a* is filled with the inert gas, and the control unit 8 controls the gas supply nozzle 4*c* such that the supply of the inert gas from the gas supply nozzle 4*c* is stopped. To explain with a specific example, the control unit 8 compares the oxygen concentration with a first predetermined value, and when the oxygen concentration is below the first predetermined value, controls the gas supply nozzle 4*c* so as to stop the supply of the inert gas. In addition, the control unit 8 compares the humidity with a second predetermined value, and when the humidity is below the second predetermined value, controls the gas supply nozzle 4*c* so as to stop the supply of the inert gas. The specified values (first specified value and second specified value) are oxygen concentration values and humidity values that create an environment in which the components in the storage space may be maintained without oxidizing, and such oxygen concentration values and humidity values are determined in advance through experiments, simulations, and the like.

Figure 6:
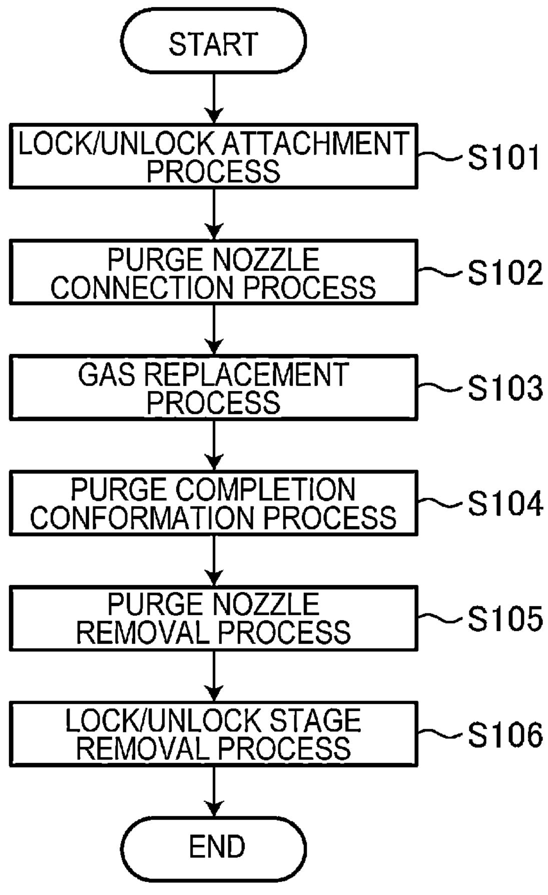
FIG. 6 is a flowchart illustrating an example of a purging process performed by the wafer storage processing apparatus according to an embodiment.

Next, an example of a purging process performed by the wafer storage container processing apparatus 1 according to the present embodiment is described. FIG. 6 is a flowchart illustrating an example of a purging process performed by the wafer storage processing apparatus 1 according to an embodiment. The purging process illustrated in FIG. 6 is performed when the vacuum drying of the FOUP 20 in the drying chamber 6 is completed.

In a lock/unlock attachment process in step S101 of the purging process illustrated in FIG. 6, the robot 3 separately transports the shell 20*a* and the door 20*b* in the drying chamber 6 onto the lock/unlock stage 4. Then, the lock/unlock stage 4 connects the shell 20*a* and the door 20*b*.

Next, in a purge nozzle connection process of step S102, the gas supply nozzle 4*c* is connected to the gas supply port 20*e*, and the gas exhaust nozzle 4*d* is inserted into the gas exhaust port 20*f*, while the FOUP 20 is disposed on the frame 4*b*.

Next, in the gas replacement process of step S103, the gas supply nozzle 4*c* starts to supply the inert gas to the storage space of the shell 20*a*, thereby starting to replace the gas in the storage space. In step S103, the control unit 8 opens the valves 4*e*1 and 4*f*1 and closes the valve 4*j*1. As a result, the collection box 4*g* starts to collect the above-mentioned mixed gas.

Next, in the purge completion confirmation process of step S104, when the measured value transmitted from the measurement unit 4*h* is equal to or greater than the predetermined value, the control unit 8 controls the gas supply nozzle 4*c* to continue the supply of the inert gas. Meanwhile, when the measured value is below the predetermined value, it is considered that the storage space of the shell 20*a* is filled with the inert gas, and the control unit 8 controls the gas supply nozzle 4*c* such that the supply of the inert gas is stopped.

When the supply of inert gas is stopped, in a purge nozzle removal process of step S105, the gas supply nozzle 4*c* is removed from the gas supply port 20*e*, and the gas exhaust nozzle 4*d* is removed from the gas exhaust port 20*f*, while the FOUP 20 is disposed on the frame 4*b*.

Then, in a lock/unlock stage removal process of step S106, the robot 3 removes the FOUP 20 from the lock/unlock stage 4, and transports the removed FOUP 20 to the unload port 7. Then, the FOUP 20 is carried out from the wafer storage container processing apparatus 1.

The wafer storage container processing apparatus 1 according to the embodiment has been described above.

Here, an example of a conventional wafer storage container processing apparatus and a conventional FOUP are described. Conventionally, there is a technology for supplying an inert gas into a FOUP to replace the gas in the FOUP. However, when there is a small gap between the shell and the door, the gas replacement may not be performed efficiently. Furthermore, since this gap differs depending on the individual FOUP, it is not possible to detect whether the gas replacement in each FOUP has been sufficiently performed. In addition, it is possible to perform a control such that the time when the gas replacement in the FOUP is expected to be completed is set as a predetermined time, and the replacement of the gas in the FOUP is determined to be completed when the predetermined time has elapsed since the start of the supply of the inert gas. However, when performing such a control, the predetermined time needs to be set to a time when the replacement is surely completed, so that it needs to be set longer. As a result, the supply of the inert gas is performed for a longer time than the time when the replacement is actually completed, which results in waste in terms of cost and processing time.

Furthermore, the conventional FOUP is provided with both a gas supply port for supplying an inert gas such as $N_2$ gas, and a gas exhaust port for exhausting a gas, and it is thought that it is possible to detect whether gas replacement is complete by measuring the gas exhausted from the gas exhaust port. However, since both of the ports are provided on the same surface of the FOUP (the bottom surface of the FOUP, i.e., the surface that intersects with the surface of the opening where the door is attached) and the two ports are provided close to each other, a relatively large amount of the inert gas may be exhausted from the gas exhaust port even when the gas replacement inside the FOUP is not complete.

In addition, in the conventional FOUP, a large amount of inert gas is discharged from the gap between the door and the shell of the FOUP, and measurement may not be possible when only a small amount of gas is discharged from the gas discharge port. Therefore, even with this method, it is difficult to detect the gas replacement state inside the FOUP.

Meanwhile, in the case of the present embodiment where the FOUP 20 is disposed on the lock/unlock stage 4 with the door 20*b* facing downwards during the purging process, the weight of the shell 20*a* presses the door 20*b* against the frame 4*b*, bringing the shell 20*a* and the door 20*b* into close contact with each other, thereby reducing the size of the gap 20*d*. Therefore, the amount of gas leaking from the gap 20*d* may be reduced. As a result, replacement of the gas in the FOUP 20 may be efficiently performed.

In addition, in the wafer storage container processing apparatus 1 of the embodiment, the FOUP 20 is arranged such that the shell 20*a* and the door 20*b* are connected and the door 20*b* is disposed on the frame 4*b*. Therefore, the oxygen concentration and humidity in the storage space may be measured even when more gas comes out of the gap 20*d* between the door 20*b* and the shell 20*a* than comes out of the gas exhaust port 20*f*.

Further, as described above, by disposing the FOUP 20 on the lock/unlock stage 4 with the door 20*b* facing downwards and performing the purging process, the slot 20*h* of the shell 20*a* is disposed to extend vertically. Therefore, gravity acts on the debris in addition to the force of the gas supply, so that the debris in the slot 20*h* tends to move towards the door 20*b*, thereby preventing debris from remaining in the slot 20*h*.

Furthermore, if the FOUP 20 were disposed such that the gas supply port 20*e* and the gas exhaust port 20*f* were on the bottom, it would be necessary to provide a member that covers the entire door 20*b* in order to catch any gas that leaks through the gap 20*d*. However, according to the embodiment, the disposition surface of the lock/unlock stage 4 also serves to cover the door 20*b*. Thus, it is only necessary to provide an additional frame 4*b* that covers the gap 20*d*.

As described above, according to the embodiment, gas replacement within the FOUP 20 may be efficiently performed.

Furthermore, compared to the conventional method of measuring only the gas discharged from one gas exhaust port, the method of the embodiment measures the gas leaking from gap 20*d* in addition to gas exhaust port 20*f*, thereby improving the reliability of the measurement.

In addition, since the lock/unlock stage 4 has a function for attaching (connecting) the door 20*b* and shell 20*a* of the FOUP 20, gas replacement and attachment of the door 20*b* and shell 20*a* may be performed at the same time and in the same place, enabling efficient purging processing.

MODIFICATION OF EMBODIMENT

Next, a modification of the embodiment will be described. In the following description of the modification, configurations different from the above-described embodiment will be mainly described, and descriptions of configurations similar to the above-described embodiment may be omitted.

Figure 7:
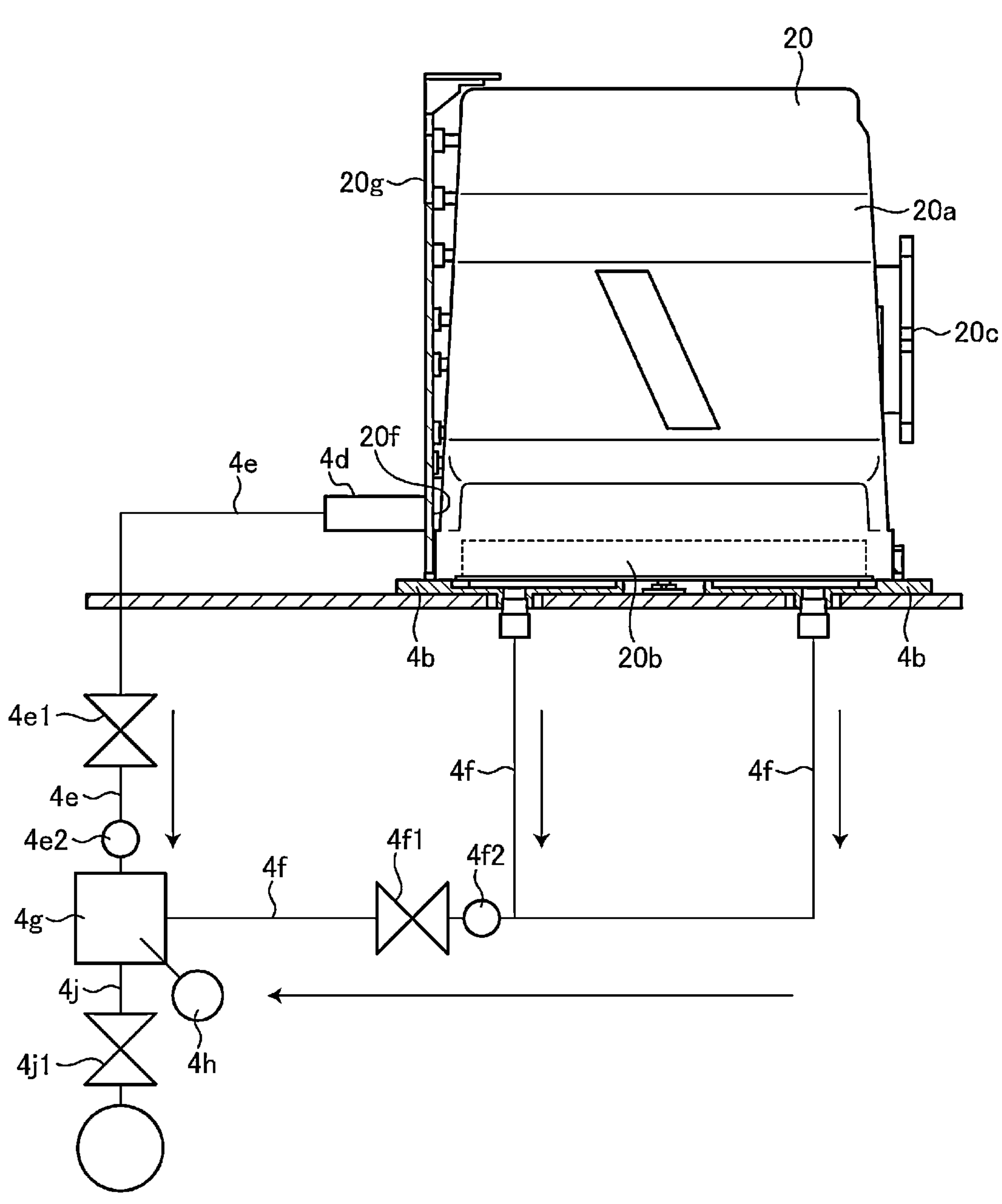
FIG. 7 is a side view of a lock/unlock stage according to a modification of the embodiment.

FIG. 7 is a side view of the lock/unlock stage 4 according to a modification of the embodiment. The lock/unlock stage 4 according to the modification illustrated in FIG. 7 differs from the lock/unlock stage 4 according to the embodiment illustrated in FIG. 4 in that a flow meter 4*e*2 and a flow meter 4*f*2 are further provided. In addition, although not illustrated in FIG. 7, the lock/unlock stage 4 according to the modification also includes a flow meter (supply gas flow meter)

provided on a gas flow path of the pipe connecting the gas tank and the gas supply nozzle 4*c*.

The flow meter 4*e*2 is provided on the path through which the gas flows in the pipe 4*e*, measures the flow rate of the gas discharged from the gas exhaust port 20*f* and flowing into the collection box 4*g* at predetermined time intervals, and transmits the measured flow rate to the control unit 8.

The flow meter 4*f*2 is provided on the path through which the gas flows in the pipe 4*f*, measures the flow rate of the gas discharged from the gas exhaust port 20*d* and flowing into the collection box 4*g* at predetermined time intervals, and transmits the measured flow rate to the control unit 8.

The supply gas flow meter measures the flow rate of the gas supplied from the gas tank to the gas supply nozzle 4*c* at predetermined time intervals, and transmits the measured flow rate to the control unit 8.

The control unit 8 according to the modification performs various controls based on the flow rates transmitted from the flow meters 4*e*2 and 4*f*2 and the supply gas flow meter. For example, the control unit 8 performs control so as to output information indicating that gas is leaking according to the received flow rate every time the control unit 8 receives the flow rate transmitted from the flow meter 4*f*2.

To explain with a specific example, the control unit 8 compares the flow rate from the flow meter 4*f*2 with a predetermined threshold value, and when the flow rate from the flow meter 4*f*2 is equal to or greater than the predetermined threshold value, the control unit 8 displays information indicating that gas is leaking from the gap 20*d* on a display connected to the control unit 8, thereby outputting the information. An example of the information indicating that gas is leaking from the gap 20*d* is a text data message saying, for example, "Gas is leaking." In addition, when the flow rate from the flow meter 4*f*2 is equal to or greater than the predetermined threshold value, the control unit 8 transmits information indicating that gas is leaking and the flow rate from the flow meter 4*f*2 together with an identification (ID) for identifying the FOUP 20 placed on the lock/unlock stage 4 to an external server that collectively manages the FOUPs 20. As a result, the information and the flow rate from the flow meter 4*f*2 are output to the external server. Then, the external server stores the ID, the information indicating that gas is leaking, and the flow rate of the leaking gas in association with each other. In addition, the history of gas leakage amounts for the FOUP 20 with the same ID may be recorded, and when the leakage amount increases over time, when the rate of increase exceeds a predetermined rate, or when the leakage amount exceeds a predetermined threshold, information to discontinue use of the FOUP 20 may be stored in association with the ID.

In addition, the control unit 8 compares the total value of the flow rate from the flow meter 4*f*2 and the flow rate from the flow meter 4*e*2 with the flow rate from the supply gas flow meter. Then, when the flow rate from the supply gas flow meter is greater than the total value, the control unit 8 determines that the gas may be leaking from a location other than the gas exhaust port 20*f*. Thus, when the flow rate from the supply gas flow meter is greater than the total value, the control unit 8 displays information indicating that the gas may be leaking, on the display. For example, an example of information indicating that the gas may be leaking is a text data message saying "Gas may be leaking from a location other than the exhaust port." In addition, when the flow rate from the supply gas flow meter is greater than the total value, the control unit 8 transmits information indicating that the gas may be leaking, together with an ID for identifying the FOUP 20 disposed on the lock/unlock stage 4 to an external server that collectively manages the FOUPs 20. As a result, the external server stores the ID and the information indicating that the gas may be leaking, in association with each other.

According to the modification, the user of the wafer storage container processing apparatus 1 may properly grasp the status of various gas leaks. Accordingly, the user may determine whether to continue using the FOUP 20 according to the gas leak status.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An apparatus for processing a wafer storage container, the wafer storage container including a body having a storage space connected to an opening, and a door detachable from the opening, the apparatus comprising:
- a stage having a disposition surface on which the wafer storage container is disposed;
- a gas supply including a gas supply nozzle that is provided on the stage and configured to supply an inert gas to the wafer storage container disposed on the stage;
- a gas collector including:
  - a recovery tank;
  - a groove formed in the stage and communicating with a gap formed between the body and the door when the door is attached to the body;
  - a gas discharge port provided on the intersecting surface of the body; and
  - a pipe connected between the groove and the recovery tank such that gas flowing through the gap is guided from the groove to the recovery tank through the pipe,
  - wherein gas present in the storage space and replaced by the inert gas supplied from the gas supply is discharged from the storage space during supply of the inert gas by at least one of leaking through the gap and being discharged through the gas discharge port, and
  - the recovery tank collects gas leaking through the gap and gas being discharged through the gas discharge port,
- wherein the gas supply nozzle is connected to a gas supply port provided on an intersecting surface of the body that intersects a surface having the opening, and
- the stage supports the wafer storage container such that the door remains attached to the body and is disposed to face downwards on the disposition surface.

2. The apparatus for processing the wafer storage container according to claim 1, wherein the stage includes a locking and unlocking latch configured to lock and unlock the door with respect to the body when the door is disposed on the disposition surface.

3. The apparatus for processing the wafer storage container according to claim 1, further comprising:
- a cleaning tank provided adjacent to the stage and configured to clean the storage space after supply of the inert gas is stopped and the door is separated from the body.

4. The apparatus for processing the wafer storage container according to claim 1, further comprising a gauge mounted in the recovery tank and configured to measure at least one of the oxygen concentration and the humidity of a mixed gas of gas collected in the recovery tank.

5. The apparatus for processing the wafer storage container according to claim 4, further comprising:

a controller connected to the gas supply and the gauge and configured to control the gas supply and the gauge; and a flow meter configured to measure a flow rate of the gas leaking through the gap, wherein, the controller controls the gas supply to stop supplying the inert gas from the gas supply when at least one of the oxygen concentration and the humidity measured by the gauge falls below a predetermined value, and when the flow rate of the gas measured by the flow meter is equal to or greater than a predetermined threshold, the controller outputs information indicating that the gas is leaking through the gap.

6. The apparatus for processing the wafer storage container according to claim 1, wherein the body of the wafer storage container includes a plurality of shelves disposed parallel to each other, each having a planar shape and on which a plurality of wafers are respectively disposed, and the stage supports the wafer storage container such that the door is disposed to face downwardly with the plurality of shelves extending vertically.

* * * * *